US007361528B2

(12) United States Patent
Lee et al.

(10) Patent No.: US 7,361,528 B2
(45) Date of Patent: Apr. 22, 2008

(54) GERMANIUM INFRARED SENSOR FOR CMOS IMAGERS

(75) Inventors: Jong-Jan Lee, Camas, WA (US); Jer-Shen Maa, Vancouver, WA (US); Sheng Teng Hsu, Camas, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 371 days.

(21) Appl. No.: 11/069,422

(22) Filed: Feb. 28, 2005

(65) Prior Publication Data

US 2006/0194415 A1    Aug. 31, 2006

(51) Int. Cl.
*H01L 21/00* (2006.01)
*H01L 21/8238* (2006.01)
*H01L 21/46* (2006.01)
*H01L 21/44* (2006.01)

(52) U.S. Cl. .................. 438/72; 438/222; 438/459; 438/608; 257/E21.092

(58) Field of Classification Search .............. 438/72, 438/222, 459, 608; 257/E21.092
See application file for complete search history.

(56) References Cited

U.S. PATENT DOCUMENTS 6,645,831 B1   11/2003   Shaeen et al.

OTHER PUBLICATIONS

Colace et al., *Efficient high-speed near-infrared Ge photodetectors integrated on Si substrates*, Applied Physics Letters, vol. 76, No. 10, pp. 1231-1233 (2000).
Lee et al., *Optimized Strained Si/Strained Ge Dual-channel Heterostructures for High Mobility P- and N-MOSFETs*, IEDM 2003, pp. 429-432.
Ritenour et al., *Epitaxial Strained Germanium p-MOSFETs with $HfO_2$ Gate Dielectric and TaN Gate Electrode*, IEDM 2003, pp. 433-436.

*Primary Examiner*—Scott B. Geyer
*Assistant Examiner*—Seahvosh Nikmanesh
(74) *Attorney, Agent, or Firm*—David C. Ripma

(57) ABSTRACT

A method of fabricating a germanium infrared sensor for a CMOS imager includes preparation of a donor wafer, including: ion implantation into a silicon wafer to form a P+ silicon layer; growing an epitaxial germanium layer on the P+silicon layer, forming a silicon-germanium interface; cyclic annealing; and implanting hydrogen ions to a depth at least as deep as the P+ silicon layer to form a defect layer; preparing a handling wafer, including: fabricating a CMOS integrated circuit on a silicon substrate; depositing a layer of refractory metal; treating the surfaces of the donor wafer and the handling wafer for bonding; bonding the handling wafer and the donor wafer to form a bonded structure; splitting the bonded structure along the defect layer; depositing a layer of indium tin oxide on the germanium layer; completing the IR sensor.

20 Claims, 3 Drawing Sheets

GERMANIUM INFRARED SENSOR FOR CMOS IMAGERS

FIELD OF THE INVENTION

This invention relates to IR sensors, and specifically to fabrication of an IR sensor wherein a germanium thin film is grown on a silicon donor wafer, followed by a bonding and layer transfer process which transfers the germanium layer to another structure.

BACKGROUND OF THE INVENTION

Photo detecting in the near-infrared regime, e.g., wavelengths of between about 0.7 µm to 2 µm, has many applications, such as fiber-optical communication, security applications and thermal imaging. Silicon photodiodes are widely used as photodetectors for the visible light regime because of their low dark current and compatibility with silicon integrated circuit technologies. Attempts have been made to deposit $Si_{1-x}Ge_x$ (SiGe) alloys, or germanium thin films, in silicon to fabricate an IR detector, however, the lattice mismatch in a SiGe-to-silicon boundary limits the maximum SiGe thickness which may be formed while still maintaining a defect free structure. Additionally, SiGe thin films having a germanium concentration of less than 50% have a relatively low IR absorption coefficient. Hence, it is difficult to fabricate an IR detector on SiGe film which has high sensitivity and low dark current.

Germanium has a high IR absorption coefficient, however, a 4% lattice mismatch to silicon results in a high dark current when a germanium photodetector is fabricated by direct deposition of germanium on silicon. A germanium photodetector having a simple PN diode structure exhibiting a very high dark current, e.g., about 30 $mA/cm^2$, has been fabricated, Colace et al., *Efficient high-speed near-infrared Ge photodetectors integrated on Si substrates*, Applied Physics Letters, Vol. 76, No. 10, pp 1231-1233 (2000).

A germanium thin film bonded to silicon or silicon dioxide has been disclosed, wherein the IR sensor and the driving CMOS circuit are both fabricated on a germanium thin film. High temperature processes are required for germanium IC processes, i.e., ion implantation activation processes are usually performed following an annealing at about 800° C. Such high temperature processes degrade the quality of germanium thin films because the thermal expansion coefficient of silicon, germanium and silicon dioxide are different. A high temperature process performed on a germanium thin film which is bonded to a silicon wafer usually results in defects in the germanium layer(s), as described in U.S. Pat. No. 6,645,831, for *Thermally stable crystalline defect-free germanium bonded to silicon and silicon dioxide*, granted Nov. 11, 2003 to Shaheen et al. Additionally, germanium IC processes are not as well established in the semiconductor industry as are silicon IC processes.

A graded SiGe growth has been demonstrated to form a thick SiGe buffer layer prior to germanium growth, Lee et al., *Optimized Strained Si/Strained Ge Dual-channel Heterostructures for High Mobility P- and N-MOSFETs*, IEDM 2003, pp 429-432.

A Germanium p-MOSFET fabricated on bulk germanium and on epi-germanium has been disclosed by Ritenour et al., *Epitaxial Strained Germanium p-MOSFETs with $HfO_2$ Gate Dielectric and TaN Gate Electrode*, IEDM 2003, pp 433-436.

In U.S. patent application Ser. No. 10/993,533, filed Nov. 19, 2004, for *Fabrication of Thin Film Germanium Infrared Sensor by Bonding to Silicon Wafer*, a germanium IR detector is described, which detector may be fabricated on a silicon CMOS circuit by a bonding process in which a germanium donor wafer is required. The size of commercial germanium wafers is smaller than that of silicon wafers, and the process is therefore unable to take advantages of larger silicon wafers.

SUMMARY OF THE INVENTION

A method of fabricating a germanium infrared sensor for a CMOS imager includes preparation of a donor wafer, including; preparation of a silicon wafer; ion implantation into the silicon wafer to form a P+ silicon layer; growing an epitaxial germanium layer on the P+ silicon layer, cyclic annealing the wafer to from a layer of high density of defects on the germanium side of the silicon-germanium interface and to diffuse ions from the P+ silicon layer into the high defect density region of the germanium layer forming a P+ germanium layer; implanting hydrogen ions to a depth at least as deep as the P+ silicon layer to form a defect layer; preparing a handling wafer, including: fabricating a CMOS integrated circuit on the silicon substrate; completing multiple metal interconnects; preparing a silicon substrate; depositing a layer of passivation oxide on the CMOS integrated circuit; planarizing the structure by CMP; forming contact or via holes; removing surface metal by CMP to form metal plugs, smoothing the metal plugs by CMP; depositing a layer of refractory metals; photomaskinig and etching to define the refractory metal to form a bottom electrode for the sensor; depositing a thin layer of dielectric, smoothing the dielectric by CMP; stopping at the level of the refractory metal; treating the surfaces of the donor wafer and the handling wafer for bonding; bonding the handling wafer and the donor wafer to form a bonded structure; splitting the bonded structure along the defect layer; depositing a layer of indium tin oxide on the germanium layer; completing the IR sensor.

It is an object of the invention to provide a method of using a silicon wafer, which has a germanium epitaxial layer thereon, as a donor wafer for bonding a germanium layer onto a silicon CMOS for use as an IR detector.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

This disclosure differs from the above-cited U.S. Patent Application in that in the previous disclosure, the germanium wafer is bonded onto a silicon CMOS wafer, and in this disclosure, a germanium thin film is grown onto a silicon donor wafer, followed by a bonding process.

Preparation of Donor Wafers

Figure 1:
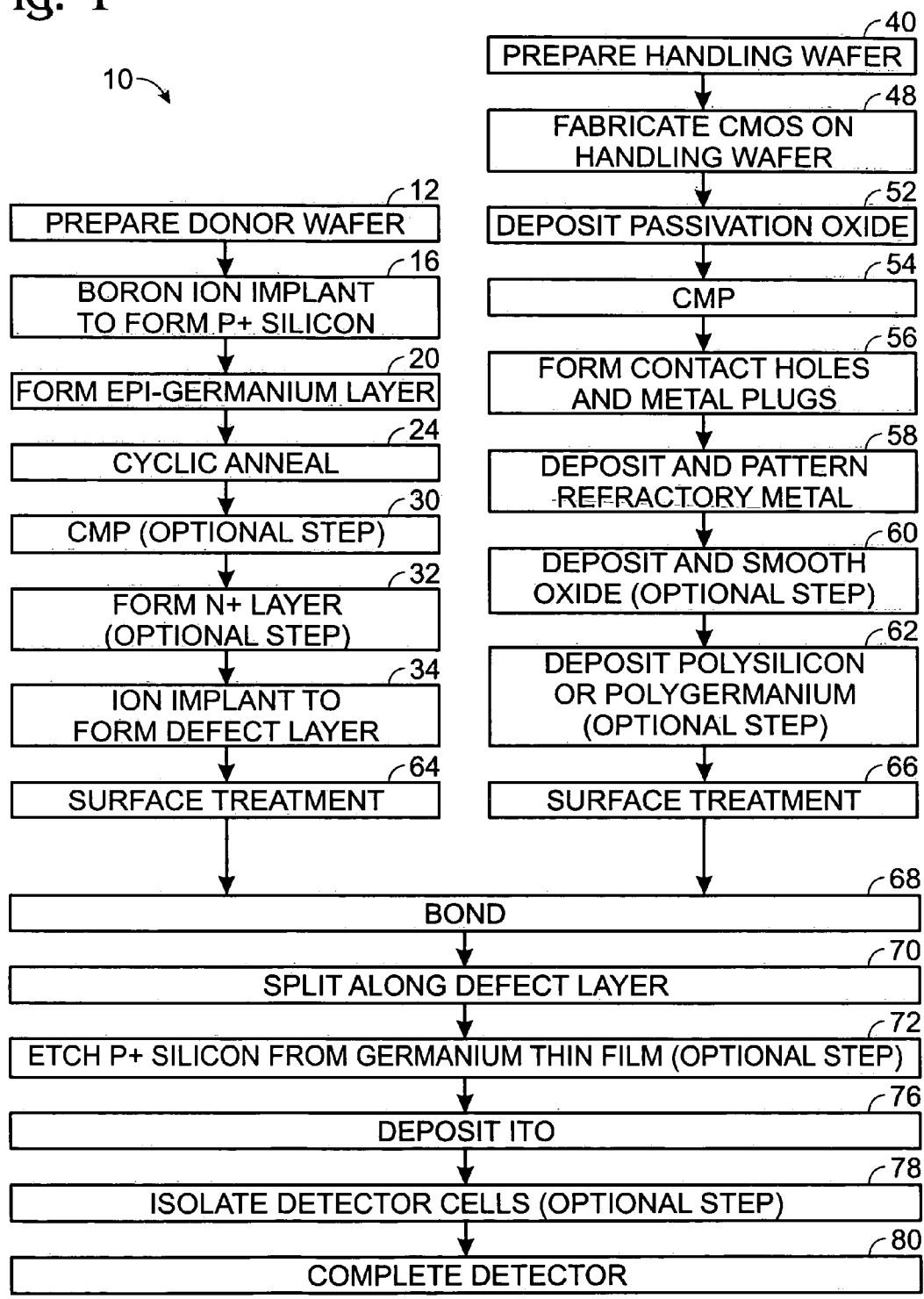
FIG. 1 is a block diagram of the method of the invention.
Figure 2:
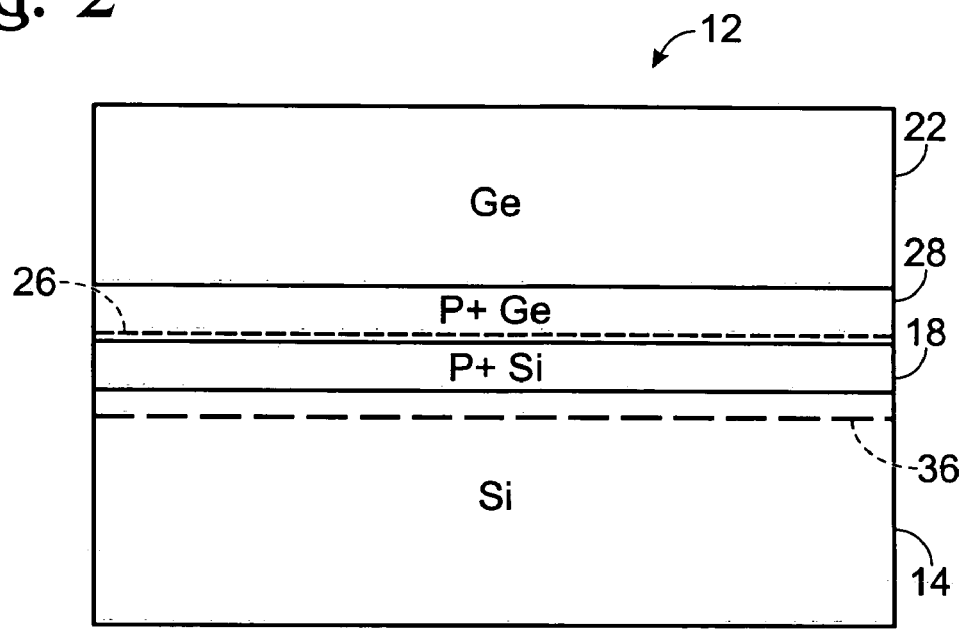
FIGS. 2-5 depicts steps in the method of the invention.

Referring now to FIGS. 1 and 2, the initial steps in the method of the invention 10 include preparation of what is referred to herein as a donor wafer 12, including preparation of a conventional silicon wafer 14. Ion implantation 16 of boron ions into the silicon wafer converts the surface layer of the donor silicon wafer to a P+ material 18. The doping density is in the order of $1 \times 10^{19} cm^{-3}$ to $1 \times 10^{20} cm^{-3}$.

The next step is epitaxial growth 20 of between about 0.5 μm to 4.0 μm of germanium 22 onto the P+ wafer material, followed by cyclic annealing 24. The range of temperature for the high temperature portion of the cyclic annealing is between about 800° C. to 900° C. The range of temperature in the low temperature portion of the cyclic annealing is between about 700° C. to 850° C. The time interval for each annealing is between about one to ten minutes, and the number of cycles is between about 5 to 50 cycles. During cyclic annealing, a layer 26 of high density of defects is created on the germanium side of the silicon-germanium interface, while the boron simultaneously diffuses from the P+ silicon layer into the high defect density region of the germanium layer, forming a P+ germanium layer 28. The donor wafer may be smoothed by an optional CMP step 30 to smooth the surface of the germanium layer, if required.

The top surface of the germanium may be implanted 32 to form a shallow N+ layer to reduce the leakage current of the IR detector, which process, is, however, an optional step. Hydrogen, argon or helium ions are implanted 34 into silicon wafer 14 to form a defect layer 36, which subsequently will be used to allow exfoliation of the surface layer of silicon donor wafer 14 along defect layer 36. The hydrogen ion implantation projected depth is into, or slightly deeper than, the P+ silicon layer. The final donor wafer is depicted in FIG. 2.

Preparation of Handling Wafers

Figure 3:
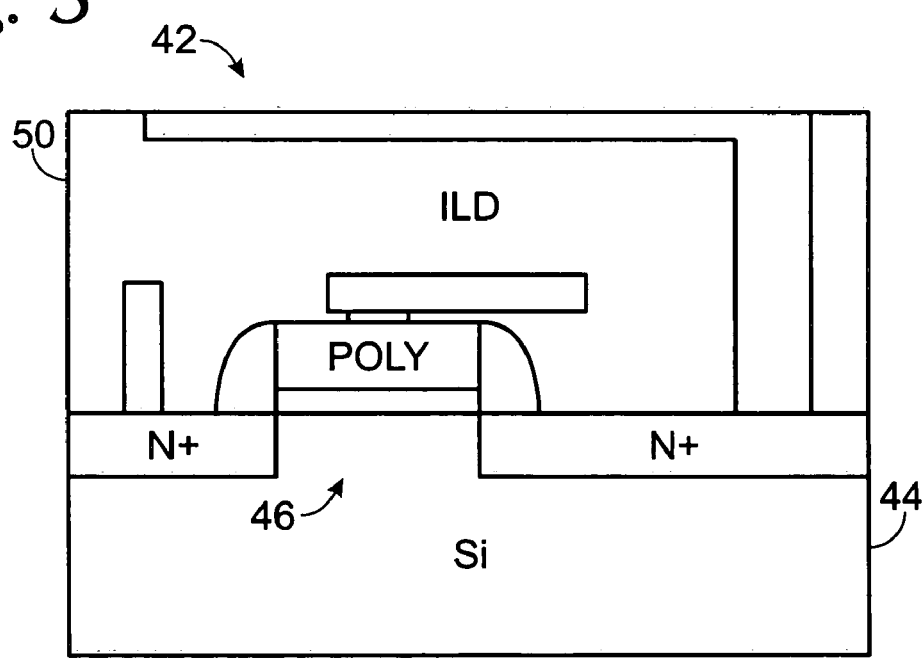

Referring now to FIGS. 1 and 3, preparation 40 of a handling wafer 42 includes a conventional silicon substrate 44, which has a CMOS integrated circuit 46 fabricated 48 thereon, including a metallization step, and, if required, multi-layer metal interconnects. A layer of passivation oxide 50 is deposited 52, and the wafer planarized by a CMP process 54. Contact holes are formed through conventional photolithographic processes, after which, metal is deposited, followed by CMP of the metal to form a detector connected to the CMOS interconnect metal plugs 56. A refractory metal such as Al, Au, Ag, Ir, Ni, Pd or Pt, is deposited 58. Photoresist is applied and patterned to define the refractory metal to form a bottom electrode of the detectors. The refractory metal is etched, and the photoresist is stripped.

At this point, an optional layer of thin oxide may be deposited and smoothed by CMP 60, stopping at the level of the refractory metal, in order further to planarize the handling wafer surface, which provides for better bonding to the germanium layer. As depicted in FIG. 3, only the pass transistor is shown. For the sake of simplicity other devices in the detector cell are not shown.

An optional layer, having a thickness of between about 5 nm to 10 nm of polysilicon or polygermanium may be deposited 62 to promote the adhesion between the germanium and the handling wafer.

Bonding

The handling wafer and the donor wafer are bonded together. Proper surface treatment 64, 66, is necessary to create a good bond. The germanium surface of the donor wafer may be treated as hydrophilic or hydrophobic, and a similar treatment may be applied to the handling wafer. Additionally, a plasma treatment may be applied to the wafer surfaces to improve the bonding strength. Bonding 68 may be perform in the temperature range of between about 200° C. to 600° C., in either a vacuum or in another suitable ambient atmosphere.

Figure 4:
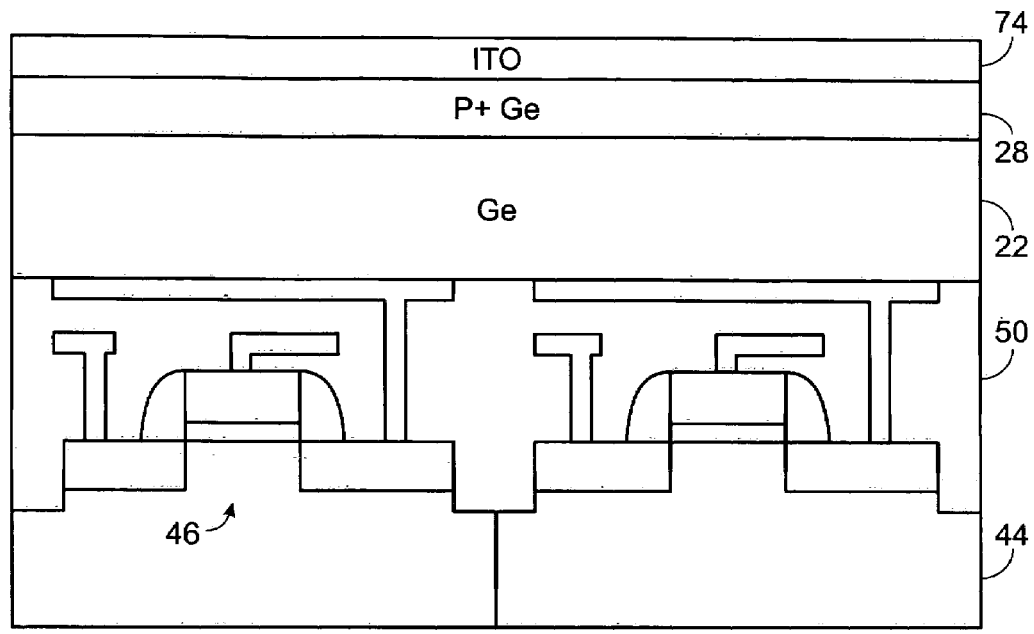

The wafers are then split 70, leaving the germanium thin film on the handling wafer, with a thin layer of P+ silicon on the germanium thin film. This layer may be selectively etched 72, or removed by a CMP process if desired, however, this is considered to be an optional process, as the P+ silicon layer has no effect on the electrical or optical properties of the completed detector. A thin layer of indium tin oxide (ITO) 74 is deposited 76 to the top of the wafer, as depicted in FIG. 4, which ITO layers serves as the ground plate of the detector.

Figure 5:
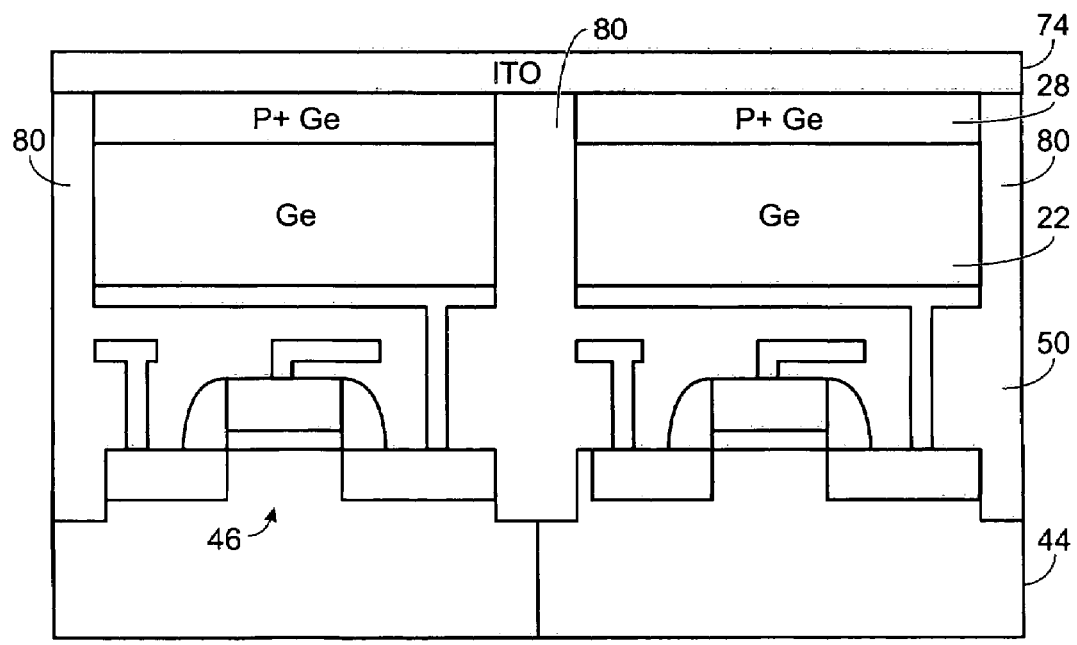

It may also desirable to isolate 78 each cell detector from one another to minimize cross talk between adjacent cells. This easily may be done by using a photoresist mask to etch the germanium layer, and subsequently filling the etched gap with silicon oxide 80, smoothing by CMP, and stopping at the surface of the germanium layer, before the deposition of the ITO transparent metal electrode, as shown in FIG. 5. It is noted that the P+ silicon on the top of P+ germanium and the optional N+ layer on the bottom of germanium layer are not shown in FIGS. 4 and 5. Because the detector is driven by an N-MOST, the top P+ germanium junction and the bottom N+ germanium junction are reverse biased when the NMOS pass transistor is turned on. The IR sensor is then completed 82 according to state-of-the-art processes.

Thus, a method for fabrication of a germanium infrared sensor for CMOS imagers has been disclosed. It will be appreciated that further variations and modifications thereof may be made within the scope of the invention as defined in the appended claims.

We claim:

1. A method of fabricating a germanium infrared sensor for a CMOS imager, comprising:
    preparation of a donor wafer, including:
        preparation of a silicon wafer;
        ion implantation into the silicon wafer to form a P+ silicon layer;
        growing an epitaxial germanium layer on the P+ silicon layer, forming a silicon-germanium interface;
        cyclic annealing to form a layer of high density of defects on the germanium side of the silicon-germanium interface and to diffuse ions from the P+ silicon layer into the high defect density region of the germanium layer forming a P+ germanium layer; and
        implanting hydrogen ions to a depth at least as deep as the P+ silicon layer to form a defect layer;
    preparing a handling wafer, including:
        preparing a silicon substrate;
        fabricating a CMOS integrated circuit on the silicon substrate;
        depositing a layer of passivation oxide on the CMOS integrated circuit;
        forming contact holes;
        depositing metal and smoothing the metal by CMP to from metal plugs in the contact holes;
        depositing a layer of refractory metal;
    treating the surfaces of the donor wafer and the handling wafer for bonding;
    bonding the handling wafer and the donor wafer to form a bonded structure;
    splitting the bonded structure along the defect layer;
    depositing a layer of indium tin oxide on the germanium layer;
    completing the IR sensor.

2. The method of claim 1 which further includes smoothing the germanium layer on the donor wafer by CMP.

3. The method of claim 1 which further includes implanting ions in the top surface of the germanium to form a shallow N+ layer.

4. The method of claim 1 which further includes, after said depositing a layer of refractory metal, photomasking and etching to form a bottom electrode for the sensor; and depositing a layer of thin oxide and smoothing by CMP, stopping at the level of the refractory metal.

5. The method of claim 1 which further includes, after said depositing a layer of refractory metal, depositing a layer of material taken from the group of materials consisting of polysilicon and polygermanium.

6. The method of claim 1 wherein said treating the surfaces of the donor wafer and the handling wafer for bonding includes treating bonding surfaces of the donor wafer and the handling wafer as hydrophilic or hydrophobic.

7. The method of claim 6 which further includes treating the bonding surfaces with a plasma treatment.

8. The method of claim 1 wherein said bonding is performed in a temperature range of between about 200 EC to 600 EC, in a vacuum or in a suitable ambient atmosphere.

9. The method of claim 1 wherein, after said splitting, a thin layer of P+ silicon is located on the germanium thin film, and wherein the thin Layer of P+ silicon is removed by a process taken from the group of processes consisting of selective etch and CMP process.

10. The method of claim 1 wherein before said depositing a layer of indium tin oxide on the germanium layer, each cell detector is isolated from adjacent cells by masking, patterning and etching, and subsequent filling of an etched gap with silicon oxide, and smoothing of the last deposited silicon oxide by CMP.

11. The method of claim 1 wherein said cyclic annealing includes annealing at a high temperature range of between about 800 EC to 900 EC, annealing at a low temperature of between about 700 EC to 850 EC, for between about one to ten minutes for each cycle, and which includes repeating the cyclic anneal for between about 5 to 50 cycles.

12. A method of fabricating a germanium infrared sensor for a CMOS imager, comprising:
preparation a donor wafer, including:
preparation of a silicon wafer;
ion implantation into the silicon wafer to form a P+ silicon layer;
growing an epitaxial germanium layer on the P+ silicon layer, forming a silicon-germanium interface;
cyclic annealing to from a layer of high density of defects on the germanium side of the silicon-germanium interface and to diffuse ions from the P+ silicon layer into the high defect density region of the germanium layer forming a P+ germanium layer, wherein said cyclic annealing includes annealing at a high temperature range of between about 800 EC to 900 EC, annealing at a low temperature of between about 700 EC to 850 EC, for between about one to ten minutes for each cycle, and which includes repeating the cyclic anneal for between about 5 to 50 cycles;
implanting hydrogen ions to a depth at least as deep as the P+ silicon layer to form a defect layer;
preparing a handling wafer, including:
preparing a silicon substrate;
fabricating a CMOS integrated circuit on the silicon substrate;
depositing a layer of passivation oxide on the CMOS integrated circuit;
forming contact holes;
depositing metal and smoothing the metal by CMP to from metal plugs in the contact holes;
depositing a layer of refractory metals;
treating the surfaces of the donor wafer and the handling wafer for bonding;
bonding the handling wafer and the donor wafer to form a bonded structure;
splitting the bonded structure along the defect layer;
depositing a layer of indium tin oxide on the germanium layer;
completing the IR sensor.

13. The method of claim 12 which further includes smoothing the germanium layer on the donor wafer by CMP.

14. The method of claim 12 which further includes implanting ions in the top surface of the germanium to form a shallow N+ layer.

15. The method of claim 12 which further includes, after said depositing a layer of refractory metal, photomasking and etching to form a bottom electrode for the sensor; and depositing a layer of thin oxide and smoothing by CMP, stopping at the level of the refractory metal.

16. The method of claim 12 which further includes, after said depositing a layer of refractory metal, depositing a layer of material taken from the group of materials consisting of polysilicon and polygermanium.

17. The method of claim 12 wherein said treating the surfaces of the donor wafer and the handling wafer for bonding includes treating bonding surfaces of the donor wafer and the handling wafer as hydrophilic or hydrophobic, and which further includes treating the bonding surfaces with a plasma treatment.

18. The method of claim 12 wherein said bonding is performed in a temperature range of between about 200 EC to 600 EC, in a vacuum or in a suitable ambient atmosphere.

19. The method of claim 12 wherein, after said splitting, a thin layer of P+ silicon is located on the germanium thin film, and wherein the thin layer of P+silicon is removed by a process taken from the group of processes consisting of selective etch and CMP process.

20. The method of claim 12 wherein before said depositing a layer of indium tin oxide on the germanium layer, each cell detector is isolated from adjacent cells by masking, patterning and etching, and subsequent filling of an etched gap with oxide, and smoothing of the last deposited oxide by CMP.

* * * * *